(12) United States Patent
Zhang et al.

(10) Patent No.: US 10,309,008 B2
(45) Date of Patent: Jun. 4, 2019

(54) WINDOW FILM AND PREPARATION METHOD THEREOF

(71) Applicant: ZHANGJIAGANG KANGDE XIN OPTRONICS MATERIAL CO., LTD., Suzhou, Jiangsu (CN)

(72) Inventors: Yuchun Zhang, Jiangsu (CN); Minghong Hsu, Jiangsu (CN)

(73) Assignee: ZHANGJIAGANG KANGDE XIN OPTRONICS MATERIAL CO., LTD., Zhangjiagang (CN)

( * ) Notice: Subject to any disclaimer, the term of this patent is extended or adjusted under 35 U.S.C. 154(b) by 240 days.

(21) Appl. No.: 15/532,456

(22) PCT Filed: Dec. 24, 2014

(86) PCT No.: PCT/CN2014/094748
§ 371 (c)(1),
(2) Date: Jun. 1, 2017

(87) PCT Pub. No.: WO2016/086472
PCT Pub. Date: Jun. 9, 2016

(65) Prior Publication Data
US 2017/0268099 A1    Sep. 21, 2017

(30) Foreign Application Priority Data
Dec. 3, 2014  (CN) .......................... 2014 1 0725141

(51) Int. Cl.
*C23C 14/35* (2006.01)
*B32B 9/04* (2006.01)
(Continued)

(52) U.S. Cl.
CPC .............. *C23C 14/352* (2013.01); *B32B 9/04* (2013.01); *B32B 15/04* (2013.01); *B32B 15/043* (2013.01);
(Continued)

(58) Field of Classification Search
CPC ..... B32B 27/02; Y10T 428/24; C23C 14/352; C23C 14/086; C23C 14/205
See application file for complete search history.

(56) References Cited

U.S. PATENT DOCUMENTS

2008/0057264 A1* 3/2008 Morimoto ............... B32B 27/02
                                                        428/98
2010/0046191 A1* 2/2010 den Boer ............. H05K 9/0088
                                                        361/818

FOREIGN PATENT DOCUMENTS

CN  101124863 A  2/2008
CN  102569433 A  7/2012
(Continued)

OTHER PUBLICATIONS

International Search Report and Written Opinion from PCT Application Serial No. PCT/CN2014/094748, dated Sep. 9, 2015, 10 pages.

*Primary Examiner* — Betelhem Shewareged
(74) *Attorney, Agent, or Firm* — Kinney & Lange, P.A.

(57) ABSTRACT

A window film is disclosed. The window film includes: a flexible transparent base material; a first metal target material film, disposed on the surface of the flexible transparent base material; a first high refractive index compound film, disposed on the surface of the first metal target material film; a first metal oxide film, disposed on the surface of the first high refractive index compound film; a first silver-containing metal film, disposed on the surface of the first metal oxide film; a second metal target material film, disposed on the surface of the first silver-containing metal film; and a second high refractive index compound film, disposed on the surface of the second metal target material film. The window film has better adherence, and is less likely to peel off. In addition, the window film also has better oxidation resistance, and is less likely to be oxidized. Furthermore, the (Continued)

window film also has a better optical effect and heat insulation effect.

16 Claims, 3 Drawing Sheets

(51) Int. Cl.
*B32B 15/04* (2006.01)
*C23C 14/08* (2006.01)
*C23C 14/18* (2006.01)
*C23C 14/20* (2006.01)
*C23C 14/34* (2006.01)
*C23C 14/54* (2006.01)

(52) U.S. Cl.
CPC .......... *C23C 14/083* (2013.01); *C23C 14/086* (2013.01); *C23C 14/185* (2013.01); *C23C 14/205* (2013.01); *C23C 14/3457* (2013.01); *C23C 14/542* (2013.01); *B32B 2311/08* (2013.01)

(56) References Cited

FOREIGN PATENT DOCUMENTS

| EP | 0990928 A1 | 4/2000 |
| JP | 2007206146 A | 8/2007 |
| JP | 2009071146 A | 4/2009 |

* cited by examiner

WINDOW FILM AND PREPARATION METHOD THEREOF

CROSS-REFERENCE TO RELATED APPLICATIONS

This application claims priority to Chinese Patent Application Window Film and Preparation Method Thereof, No. 201410725141.X, filed to the China Patent Office on Dec. 3, 2014, the entire contents of which are incorporated herein by reference.

TECHNICAL FIELD

The present disclosure relates to the technical field of functional films, and more particularly to, a window film and a preparation method thereof.

BACKGROUND

A window film is commonly used on a building window or a vehicle window. An earlier window film is prepared using a coating process and is called as sun paper or tea paper, this window film plays a main role in shading strong sunlight, and does not have a heat insulation effect basically.

Based on the researches, a window film prepared by a process of adding a heat absorbent in a deep dyeing way can absorb infrared rays in sunlight so as to achieve a heat insulation effect. However, this window film absorbs visible light at the same time of absorbing the infrared rays, thereby causing insufficient transmittance of the visible light and poorer definition. In addition, the heat insulation function of this window film quickly attenuate, and this window film is more likely to fade.

In order to improve the heat insulation of the foregoing window film, people prepare a window film using a vacuum heat evaporation process. The vacuum heat evaporation process refers to evaporating an aluminum layer on a base material so as to achieve a heat insulation effect. The window film prepared using this method has persistent heat insulation. However, the clarity of this window film is lower, the vision comfort is affected, and the light reflection is higher.

In order to improve the clarity and reduce the reactivity, a window film is prepared using a metal magnetron-sputtering process currently. The metal magnetron-sputtering process refers to: uniformly sputtering metal particles of materials such as nickel, silver, titanium and gold to a high-tension Polyethylene Terephthalate (PET) base material at high speed with high strength under the interaction of an electric field and a magnetic field using a multi-cavity high-speed rotating device. The window film prepared using the magnetron-sputtering process has, higher clarity and low reflective characteristics, in addition to better metallicity and stable heat insulation performance.

Chinese Patent Application No. 201110403335.4 discloses low-radiation coating glass and a manufacturing method thereof. The coating includes a plurality of dielectric combination layers and AZO (Aluminum-doped Zinc Oxide) medium unit layers disposed between the adjacent dielectric combination layers; the AZO medium unit layer includes a functional layer and AZO medium barrier layers, the AZO medium barrier layers lay on two sides of the functional layer. The low-radiation coating provided in the conventional art has the advantages of high transmittance and low reflection of visible light and low transmittance and high reflection of infrared light. However, this low-radiation film is poorer in adherence, a vehicle window is glass having a certain curved surface, the curved glass cannot be directly coated with a coating, the surface of a flexible base material is coated with a coating firstly, and then the flexible base material is adhered to the vehicle window glass. Since this low-radiation coating is poorer in adherence and is more likely to peel off from the flexible base material, application of this low-radiation coating to the field of window films is restricted.

SUMMARY

In view of this, the present disclosure is intended to provide a window film. The window film provided by the present disclosure has better adherence.

The present disclosure provides a window film, which includes:

a flexible transparent base material, the flexible transparent base material serving as a substrate;

a first metal target material film, disposed on the surface of the flexible transparent base material;

a first high refractive index compound film, disposed on the surface of the first metal target material film, a refractive index of the first high refractive index compound film ranging from 2.0 to 2.5;

a first metal oxide film, disposed on the surface of the first high refractive index compound film, a material of the first metal oxide film being selected from a transition metal oxide or a tin oxide;

a first silver-containing metal film, disposed on the surface of the first metal oxide film;

a second metal target material film, disposed on the surface of the first silver-containing metal film; and a second high refractive index compound film, disposed on the surface of the second metal target material film, a refractive index of the second high refractive index compound film ranging from 2.0 to 2.5.

Preferably, the window film further includes:

a second metal oxide film, disposed on the surface of the second high refractive index compound film, a material of the second metal oxide film being selected from a transition metal oxide or a tin oxide;

a second silver-containing metal film, disposed on the surface of the second metal oxide film, and a third metal target material film, disposed on the surface of the second silver-containing metal film; and a third high refractive index compound film, disposed on the surface of the third metal target material film, a refractive index of the third high refractive index compound film ranging from 2.0 to 2.5.

Preferably, a thickness of the flexible transparent base material ranges from 20 microns to 30 microns.

Preferably, a material of the first metal target material film, a material of the second metal target material film, and a material of the third metal target material film are independently selected from Zn, Ti, Cu, Ni, NiCr or Cr.

Preferably, a thickness of the third metal target material film, a thickness of the second metal target material film, and a thickness of the first metal target material film are independently range from 0.2 nm to 0.8 nm.

Preferably, the refractive index of the third high refractive index compound film, the refractive index of the second high refractive index compound film, and the refractive index of the first high refractive index compound film are independently range from 2.2 to 2.3.

Preferably, a material of the third high refractive index compound film, a material of the second high refractive index compound film, and a material of the first high refractive index compound film are independently selected from $Nb_2O_5$, ITO, $Si_3N_4$, $SnO_2$, $TiO_2$ or $TaO_2$.

Preferably, a thickness of the first high refractive index compound film ranges from 22 nm to 30 nm.

Preferably, a material of the first metal oxide film and a material of the second metal oxide film are independently selected from zinc oxides, AZOs or tin oxides.

Preferably, a thickness of the first metal oxide film and the thickness of the second metal oxide film independently ranges from 1 nm to 5 nm.

Preferably, a material of the first silver-containing metal film and a material of the second silver-containing metal film are independently selected from silver alloys.

Preferably, a thickness of the first silver-containing metal film and the thickness of the second silver-containing metal film independently ranges from 5 nm to 10 nm.

Preferably, a thickness of the second high refractive index compound film ranges from 22 nm to 28 nm.

Preferably, a thickness of the third high refractive index compound film ranges from 20 nm to 30 nm.

Preferably, the Visible Light Transmittance (VLT) of the window film within a range of 380 nm to 780 nm is greater than 72%, and the Infrared Light Transmittance (IRT) of the window film within a range of 780 nm to 2,500 nm is less than 10%.

The window film provided by the present disclosure has better adherence, can be better adhered to a flexible transparent base material, and is less likely to peel off. An experimental result shows that the window film provided by the present disclosure does not peel off absolutely.

In addition, the window film provided by the present disclosure also has better oxidation resistance, and is less likely to be oxidized. An experimental result shows that the window film provided by the present disclosure is tested for 2,000 hours in an aging tester (QUV), a color difference value $\Delta E$ being less than 1. Furthermore, the window film provided by the present disclosure also has a better optical effect, and is particularly suitable for serving as a front windshield film of a vehicle. An experimental result shows that the VLT of the window film provided by the present disclosure within a range of 380 nm to 780 nm is greater than 72%, and the IRT of the window film within a range of 780 nm to 2,500 nm is less than 10%. Moreover, the window film provided by the present disclosure also has a better heat insulation effect, an experimental result shows that after the window film provided by the present disclosure is irradiated with an infrared lamp for 1,500 s, the temperature rises for 2 to 3 DEG C.

The present disclosure provides a preparation method for a window film, which includes the steps as follows.

1) A first metal target material is magnetron-sputtered onto the surface of a flexible transparent base material, so as to obtain a first metal target material film disposed on the surface of the flexible transparent base material;

2) A first high refractive index compound is magnetron-sputtered onto the surface of the first metal target material film, so as to obtain a first high refractive index compound film disposed on the surface of the first metal target material film, a refractive index of the first high refractive index compound ranging from 2.0 to 2.5;

3) A first metal oxide is magnetron-sputtered onto the surface of the first high refractive index compound film, so as to obtain a first metal oxide film disposed on the surface of the first high refractive index compound film, the first metal oxide being selected from a transition metal oxide or a tin oxide;

4) First silver-containing metal is magnetron-sputtered onto the surface of the first metal oxide film, so as to obtain a first silver-containing metal film disposed on the surface of the first metal oxide film;

5) A second metal target material is magnetron-sputtered onto the surface of the first silver-containing metal film, so as to obtain a second metal target material film disposed on the surface of the first silver-containing metal film;

6) A second high refractive index compound is magnetron-sputtered onto the surface of the second metal target material film, so as to obtain a window film, a refractive index of the second high refractive index compound ranging from 2.0 to 2.5.

The window film prepared using the method provided by the present disclosure has better adherence, can be better adhered to a flexible transparent base material, and is less likely to peel off. In addition, the window film prepared using the method provided by the present disclosure also has better oxidation resistance, optical effect and heat insulation effect. Furthermore, the preparation method for the window film provided by the present disclosure is simple in process, and simple and convenient to operate, and facilitates implementation of quantitative production.

BRIEF DESCRIPTION OF THE DRAWINGS

In order to more clearly illustrate the technical solutions in the embodiments of the present disclosure or the conventional art, drawings needing to be used in descriptions of the embodiments or the conventional art will be simply introduced. Obviously, the drawings described below are only the embodiments of the present disclosure, on the premise of no creative work, those skilled in the art may obtain other drawings according to the provided drawings.

DETAILED DESCRIPTION OF THE EMBODIMENTS

Figure 1:
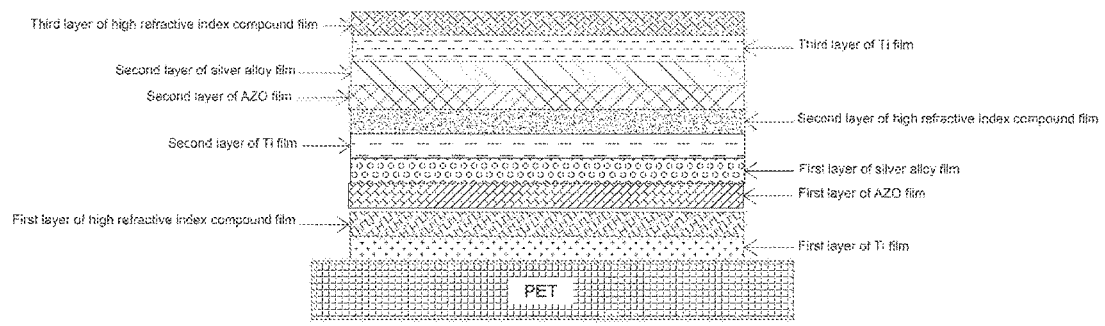
FIG. 1 is a structural diagram of a window film provided in an embodiment of the present disclosure.

The technical solutions in the embodiments of the present disclosure are clearly and completely described below. Obviously, the described embodiments are only a part of the embodiments of the present disclosure, not all of the embodiments. On the basis of the embodiments of the present disclosure, all other embodiments obtained on the premise of no creative work of those skilled in the art fall within the protective scope of the present disclosure.

The present disclosure provides a window film, which includes:

a flexible transparent base material, the flexible transparent base material serving as a substrate;

a first metal target material film, disposed on the surface of the flexible transparent base material;

a first high refractive index compound film, disposed on the surface of the first metal target material film, a refractive index of the first high refractive index compound film ranging from 2.0 to 2.5;

a first metal oxide film, disposed on the surface of the first high refractive index compound film, a material of the first metal oxide film being selected from a transition metal oxide or a tin oxide;

a first silver-containing metal film, disposed on the surface of the first metal oxide film;

a second metal target material film, disposed on the surface of the first silver-containing metal film; and a second high refractive index compound film, disposed on the surface of the second metal target material film, a refractive index of the second high refractive index compound film ranging from 2.0 to 2.5.

The window film provided by the present disclosure includes the flexible transparent base material. The type and source of the flexible transparent base material are not specially restricted in the present disclosure, and a substrate material which is familiar to those skilled in the art and may be used for preparing a window film is adopted, and may be purchased on the market. In an embodiment of the present disclosure, the flexible transparent base material may be Polyethylene Terephthalate (PET), and in other embodiments, the flexible transparent base material may also be Ultraviolet (UV)-cutoff PET. In an embodiment of the present disclosure, the cutoff wavelength of the UV-cutoff PET may range from 300 nm to 380 nm. In an embodiment of the present disclosure, the UV light transmittance T of the UV-cutoff PET is less than 2%. In an embodiment of the present disclosure, the UV-cutoff PET may be prepared by adding a UV adsorbent into common PET. In an embodiment of the present disclosure, the thickness of the flexible transparent base material may range from 20 microns to 30 microns, and in other embodiments, the thickness of the flexible transparent base material may range from 22 microns to 26 microns.

The window film provided by the present disclosure includes the first metal target material film disposed on the surface of the flexible transparent base material. In the present disclosure, the material of the first metal target material film is a metal target material. The type and source of the metal target material are not specially restricted in the present disclosure, and a metal target material which is familiar to those skilled in the art is adopted, and may be purchased on the market. In a preferred embodiment of the present disclosure, the material of the first metal target material film may be Zn, Ti, Cu, Ni, NiCr or Cr, in other preferred embodiments, the material of the first metal target material film may be Ti, Cu, Ni or NiCr, and in another preferred embodiment, the material of the first metal target material film may be Ti or NiCr. In an embodiment of the present disclosure, the thickness of the first metal target material film may range from 0.2 nm to 0.8 nm, and in another embodiment, the thickness of the first metal target material film may range from 0.3 nm to 0.5 nm. In the present disclosure, the first metal target material film disposed on the surface of the flexible base material has better adherence, such that the adherence of the window film provided by the present disclosure is better.

The window film provided by the present disclosure includes the first high refractive index compound film disposed on the surface of the first metal target material film, the refractive index of the first high refractive index compound film ranging from 2.0 to 2.5. In the present disclosure, the material of the first high refractive index compound film is high refractive index compounds, the refractive index of the high refractive index compound ranging from 2.0 to 2.5. In an embodiment of the present disclosure, the refractive index of the high refractive index compound may range from 2.2 to 2.3. In an embodiment of the present disclosure, the material of the first high refractive index compound film may be $Nb_2O_5$, ITO, $Si_3N_4$, $SnO_2$, $TiO_2$ or $TaO_2$, and in a preferred embodiment of the present disclosure, the material of the first high refractive index compound film may be $Nb_2O_5$, ITO, $Si_3N_4$ or $SnO_2$. The source of the high refractive index compound is not specially restricted in the present disclosure, and a high refractive index compound of the above type which is familiar to those skilled in the art is adopted, and may be purchased on the market.

In an embodiment of the present disclosure, the thickness of the first high refractive index compound film may range from 22 nm to 30 nm, and in other embodiments, the thickness of the first high refractive index compound film may range from 23 nm to 27 nm.

The window film provided by the present disclosure includes the first metal oxide film disposed on the surface of the first high refractive index compound film, the material of the first metal oxide film being selected from a transition metal oxide or a tin oxide. In an embodiment of the present disclosure, the material of the first metal oxide film may be a zinc oxide, an Aluminum-doped Zinc Oxides (AZO) or a tin oxide. The source of the transition metal oxide or the tin oxide is not specially restricted in the present disclosure, and a transition metal oxide or a tin oxide of the above type which is familiar to those skilled in the art is adopted, and may be purchased on the market.

In an embodiment of the present disclosure, the thickness of the first metal oxide film may range from 1 nm to 5 nm, and in other embodiments, the thickness of the first metal oxide film may range from 2 nm to 3 nm. In the present disclosure, the color scale of the window film provided by the present disclosure may be finely adjusted by adjusting the thickness of the first metal oxide film.

The window film provided by the present disclosure includes the first silver-containing metal film disposed on the surface of the first metal oxide film. In the present disclosure, the material of the first silver-containing metal film is silver-containing metal. In the present disclosure, the silver-containing metal may be elemental silver or may be a silver alloy. In a preferred embodiment of the present disclosure, the silver-containing metal may be the silver alloy. In a preferred embodiment of the present disclosure, the mass content of silver in the silver alloy may be greater than 98%, and the balance is selected from one or more of Zn, Cu, In, Pt, Pd and Au. The source of the silver-containing metal is not specially restricted in the present disclosure, and elemental silver or a silver alloy which is familiar to those skilled in the art is adopted, may be purchased on the market, or may be prepared in accordance with an alloy preparation method familiar to those skilled in the art.

In an embodiment of the present disclosure, the thickness of the first silver-containing metal film may range from 5 nm to 10 nm, and in other embodiments, the thickness of the first silver-containing metal film may range from 6 nm to 8 nm. In the present disclosure, the first silver-containing metal film enables the window film provided by the present disclosure to have better oxidation resistance. The window film provided by the present disclosure includes the second metal target material film disposed on the surface of the first silver-containing metal film. In an embodiment of the present disclosure, the thickness of the second metal target material film may range from 0.2 nm to 0.8 nm, and in other embodiments, the thickness of the second metal target material film may range from 0.3 nm to 0.5 nm. In the present disclosure, the color scale of the window film provided by the present disclosure may be slightly adjusted by adjusting the thickness of the second metal target material film. In the present disclosure, the second metal target material film may protect the first silver-containing metal film.

In the present disclosure, the material of the second metal target material film is a metal target material. In the present disclosure, the type and source of the metal target material are consistent with those of the metal target material in the above technical solution, which will not be elaborated herein. In the present disclosure, the first metal target material film and the second metal target material film may be identical or different. In a preferred embodiment of the present disclosure, the material of the second metal target material film may be Ti or NiCr.

The window film provided by the present disclosure includes the second high refractive index compound film disposed on the surface of the second metal target material film, the refractive index of the second high refractive index compound film ranging from 2.0 to 2.5. In the present disclosure, the type and source of the material of the second high refractive index compound film are consistent with those of the material of the first high refractive index compound film in the above technical solution, which will not be elaborated herein. In the present disclosure, the first high refractive index compound film and the second high refractive index compound film may be identical or different. In a preferred embodiment of the present disclosure, the material of the second high refractive index compound film may be $Nb_2O_5$, ITO, $Si_3N_4$ or $SnO_2$.

In an embodiment of the present disclosure, the thickness of the second high refractive index compound film may range from 22 nm to 27 nm, and in other embodiments, the thickness of the second high refractive index compound film may range from 23 nm to 26 nm.

In a preferred embodiment of the present disclosure, the window film further includes:

a second metal oxide film, disposed on the surface of the second high refractive index compound film, the material of the second metal oxide film being selected from a transition metal oxide or a tin oxide;

a second silver-containing metal film, disposed on the surface of the second metal oxide film;

a third metal target material film, disposed on the surface of the second silver-containing metal film; and a third high refractive index compound film, disposed on the surface of the third metal target material film, the refractive index of the third high refractive index compound film ranging from 2.0 to 2.5.

In a preferred embodiment, the window film includes, on the basis of a first structure composed of the first metal target material film, the first high refractive index compound film, the first metal oxide film, the first silver-containing metal film, the second metal target material film and the second high refractive index compound film, a second structure composed of the second metal oxide film, the second silver-containing metal film, the third metal target material film and the third high refractive index compound film. The first structure and the second structure are repeated structures. Therefore, in an embodiment of the present disclosure, when the window film includes the first structure and the second structure simultaneously, the thickness of the second high refractive index compound film in the first structure may be two times the thickness of the second high refractive index compound film in a window film only including the first structure. In an embodiment of the present disclosure, when the window film includes the first structure and the second structure simultaneously, the thickness of the second high refractive index compound film in the first structure may range from 45 nm to 55 nm.

The window film provided by the present disclosure further includes the second metal oxide film disposed on the surface of the second high refractive index compound film, the material of the second metal oxide film being selected from a transition metal oxide or a tin oxide. In the present disclosure, the second metal oxide film may further protect the first silver-containing metal film. In the present disclosure, the thickness of the second metal oxide film and the type and source of the material of the second metal oxide film are consistent with the thickness of the first metal oxide film and the type and source of the material of the first metal oxide film in the above technical solution, which will not be elaborated herein. In the present disclosure, the first metal oxide film and the second metal oxide film may be identical or different. In an embodiment of the present disclosure, the thickness of the second metal oxide film may range from 1 nm to 3 nm. In the present disclosure, the color scale of the window film provided by the present disclosure may be slightly adjusted by adjusting the thickness of the second metal oxide film.

The window film provided by the present disclosure further includes the second silver-containing metal film disposed on the surface of the second metal oxide film. In the present disclosure, the thickness of the second silver-containing metal film and the type and source of the material of the second silver-containing metal film are consistent with the thickness of the first silver-containing metal film and the type and source of the material of the first silver-containing metal film in the above technical solution, which will not be elaborated herein. In the present disclosure, the first silver-containing metal film and the second silver-containing metal film may be identical or different. In a preferred embodiment of the present disclosure, the material of the second silver-containing metal film may be a silver alloy. In an embodiment of the present disclosure, the thickness of the second silver-containing metal film may range from 5 nm to 12 nm.

The window film provided by the present disclosure further includes the third metal target material film disposed on the surface of the second silver-containing metal film. In an embodiment of the present disclosure, the thickness of the third metal target material film may range from 0.2 nm to 0.8 nm, and in other embodiments, the thickness of the third metal target material film may range from 0.3 nm to 0.5 nm. In the present disclosure, the color scale of the window film provided by the present disclosure may be slightly adjusted by adjusting the thickness of the third metal target material film. In the present disclosure, the third metal target material film may protect the second silver-containing metal film.

In the present disclosure, the material of the third metal target material film is a metal target material. In the present disclosure, the type and source of the material of the third metal target material film are consistent with those of the material of the first metal target material film in the above technical solution, which will not be elaborated herein. In the present disclosure, the first metal target material film, the second metal target material film and the third metal target material film may be identical or different. In a preferred embodiment of the present disclosure, the material of the third metal target material film may be Ti or NiCr.

The window film provided by the present disclosure further includes the third high refractive index compound film disposed on the surface of the third metal target material film, the refractive index of the third high refractive index compound film ranging from 2.0 to 2.5. In the present disclosure, the type and source of the material of the third high refractive index compound film are consistent with those of the material of the first high refractive index compound film in the above technical solution, which will not be elaborated herein. In the present disclosure, the first high refractive index compound film, the second high refractive index compound film and the third high refractive index compound film may be identical or different. In a preferred embodiment of the present disclosure, the material of the third high refractive index compound film may be $Nb_2O_5$, ITO, $Si_3N_4$ or $SnO_2$.

In an embodiment of the present disclosure, the thickness of the third high refractive index compound film may range from 20 nm to 30 nm, in other embodiments, the thickness of the third high refractive index compound film may range from 23 nm to 29 nm, and in another embodiment, the thickness of the third high refractive index compound film may range from 24 nm to 26 nm.

FIG. 1 is a structural diagram of a window film provided in an embodiment of the present disclosure. As shown in FIG. 1, the window film provided by the embodiment of the present disclosure includes PET, a first layer of Ti film disposed on the surface of the PET, a first layer of high refractive index compound film disposed on the surface of the first layer of Ti film, a first layer of AZO film disposed on the surface of the first layer of high refractive index compound film, a first layer of silver alloy film disposed on the surface of the first layer of AZO film, a second layer of Ti film disposed on the surface of the first layer of silver alloy film, a second layer of high refractive index compound film disposed on the surface of the second layer of Ti film, a second layer of AZO film disposed on the surface of the second layer of high refractive index compound film, a second layer of silver alloy film disposed on the surface of the second layer of AZO film, a third layer of Ti film disposed on the surface of the second layer of silver alloy film, and a third layer of high refractive index compound film disposed on the surface of the third layer of Ti film. The high refractive index compound and the silver alloy are consistent with the high refractive index compound and the silver alloy in the above technical solution, which will not be elaborated herein.

The present disclosure provides a preparation method for a window film, which includes the steps as follows:

1) magnetron-sputtering a first metal target material onto the surface of a flexible transparent base material, obtaining a first metal target material film disposed on the surface of the flexible transparent base material;

2) magnetron-sputtering a first high refractive index compound onto the surface of the first metal target material film, obtaining a first high refractive index compound film disposed on the surface of the first metal target material film, the refractive index of the first high refractive index compound ranging from 2.0 to 2.5;

3) magnetron-sputtering a first metal oxide onto the surface of the first high refractive index compound film, obtaining a first metal oxide film disposed on the surface of the first high refractive index compound film, the first metal oxide being selected from a transition metal oxide or a tin oxide;

4) magnetron-sputtering first silver-containing metal onto the surface of the first metal oxide film, obtaining a first silver-containing metal film disposed on the surface of the first metal oxide film;

5) magnetron-sputtering a second metal target material onto the surface of the first silver-containing metal film, obtaining a second metal target material film disposed on the surface of the first silver-containing metal film; and 6) magnetron-sputtering a second high refractive index compound onto the surface of the second metal target material film, obtaining a window film, the refractive index of the second high refractive index compound ranging from 2.0 to 2.5. In a preferred embodiment of the present disclosure, the preparation method for a window film further includes the steps as follows:

Magnetron-sputtering a second metal oxide onto the surface of the second high refractive index compound film, obtaining a second metal oxide film disposed on the surface of the second high refractive index compound film, the second metal oxide being selected from a transition metal oxide or a tin oxide;

Magnetron-sputtering a second silver-containing metal onto the surface of the second metal oxide film, obtaining a second silver-containing metal film disposed on the surface of the second metal oxide film;

Magnetron-sputtering a third metal target material onto the surface of the second silver-containing metal film, obtaining a third metal target material film disposed on the surface of the second silver-containing metal film;

Magnetron-sputtering a third high refractive index oxide onto the surface of the third metal target material film, obtaining a window film, the refractive index of the third high refractive index oxide ranging from 2.0 to 2.5.

In the present disclosure, the first metal target material is magnetron-sputtered onto the surface of the flexible transparent base material, so as to obtain the first metal target material film disposed on the surface of the flexible transparent base material. In the present disclosure, the types and sources of the metal target material and the flexible transparent base material are consistent with the types and sources of the metal target material and the flexible transparent base material in the above technical solution, which will not be elaborated herein. In the present disclosure, the thickness of the first metal target material film is consistent with that of the first metal target material film in the above technical solution, which will not be elaborated herein. A method for magnetron-sputtering the first metal target material onto the surface of the flexible transparent base material is not specially restricted in the present disclosure, and a magnetron-sputtering technical solution familiar to those skilled in the art is adopted. In an embodiment of the present disclosure, sputtering gas for magnetron-sputtering the first metal target material onto the surface of the flexible base material may be Ar gas. In an embodiment of the present disclosure, the thickness of the first metal target material film may be adjusted by controlling magnetron-sputtering power.

After the first metal target material film is obtained, the first high refractive index compound is magnetron-sputtered onto the surface of the first metal target material film in the present disclosure, so as to obtain the first high refractive index compound film disposed on the surface of the first metal target material film, the refractive index of the first high refractive index compound ranging from 2.0 to 2.5. In the present disclosure, the type and source of the first high refractive index compound are consistent with the type and source of the high refractive index compound in the above technical solution, which will not be elaborated herein. In the present disclosure, the thickness of the first high refractive index compound film is consistent with that of the first high refractive index compound film in the above technical solution, which will not be elaborated herein. A method for magnetron-sputtering the first high refractive index compound onto the surface of the first metal target material film is not specially restricted in the present disclosure, and a magnetron-sputtering technical solution familiar to those skilled in the art is adopted. In an embodiment of the present disclosure, sputtering gas for magnetron-sputtering the first high refractive index compound onto the surface of the first metal target material film may be Ar gas. In an embodiment of the present disclosure, sputtering gas and reactive gas for magnetron-sputtering the first high refractive index compound onto the surface of the first metal target material film may respectively be Ar gas and oxygen. In an embodiment of the present disclosure, the thickness of the first high refractive index compound film may be adjusted by controlling magnetron-sputtering power.

After the first high refractive index compound film is obtained, the first metal oxide is magnetron-sputtered onto the surface of the first high refractive index compound film in the present disclosure, so as to obtain the first metal oxide film disposed on the surface of the first high refractive index compound film. In the present disclosure, the type and source of the first metal oxide are consistent with the type and source of the metal oxide in the above technical solution, which will not be elaborated herein. In the present disclosure, the thickness of the first metal oxide film is consistent with that of the first metal oxide film in the above technical solution, which will not be elaborated herein. A method for magnetron-sputtering the first metal oxide onto the surface of the first high refractive index compound film is not specially restricted in the present disclosure, and a magnetron-sputtering technical solution familiar to those skilled in the art is adopted. In an embodiment of the present disclosure, sputtering gas for magnetron-sputtering the first metal oxide onto the surface of the first high refractive index compound film may be Ar gas. In an embodiment of the present disclosure, sputtering gas and reactive gas for magnetron-sputtering the first metal oxide onto the surface of the first high refractive index compound film may respectively be Ar gas and oxygen. In an embodiment of the present disclosure, the thickness of the first metal oxide film may be adjusted by controlling magnetron-sputtering power.

After the first metal oxide film is obtained, the first silver-containing metal is magnetron-sputtered onto the surface of the first metal oxide film in the present disclosure, so as to obtain the first silver-containing metal film disposed on the surface of the first metal oxide film. In the present disclosure, the type and source of the first silver-containing metal are consistent with the type and source of the silver-containing metal in the above technical solution, which will not be elaborated herein. In the present disclosure, the thickness of the first silver-containing metal film is consistent with that of the first silver-containing metal film in the above technical solution, which will not be elaborated herein. A method for magnetron-sputtering the first silver-containing metal onto the surface of the first metal oxide film is not specially restricted in the present disclosure, and a magnetron-sputtering technical solution familiar to those skilled in the art is adopted. In an embodiment of the present disclosure, sputtering gas for magnetron-sputtering the first silver-containing metal onto the surface of the first metal oxide film may be Ar gas. In an embodiment of the present disclosure, the thickness of the first silver-containing metal film may be adjusted by controlling magnetron-sputtering power.

After the first silver-containing metal film is obtained, the second metal target material is magnetron-sputtered onto the surface of the first silver-containing metal film in the present disclosure, so as to obtain the second metal target material film disposed on the surface of the first silver-containing metal film. In the present disclosure, the type and source of the second metal target material are consistent with the type and source of the metal target material in the above technical solution, which will not be elaborated herein. In the present disclosure, the first metal target material and the second metal target material may be identical or different. In the present disclosure, the thickness of the second metal target material film is consistent with that of the second metal target material film in the above technical solution, which will not be elaborated herein. A method for magnetron-sputtering the second metal target material onto the surface of the first silver-containing metal film is not specially restricted in the present disclosure, and a magnetron-sputtering technical solution familiar to those skilled in the art is adopted. In an embodiment of the present disclosure, sputtering gas for magnetron-sputtering the second metal target material onto the surface of the first silver-containing metal film may be Ar gas. In an embodiment of the present disclosure, the thickness of the second metal target material film may be adjusted by controlling magnetron-sputtering power.

After the second metal target material film is obtained, the second high refractive index compound is magnetron-sputtered onto the surface of the second metal target material film in the present disclosure, so as to obtain the second high refractive index compound film disposed on the surface of the second metal target material film, the refractive index of the second high refractive index compound ranging from 2.0 to 2.5. In the present disclosure, the type and source of the second high refractive index compound are consistent with the type and source of the high refractive index compound in the above technical solution, which will not be elaborated herein. In the present disclosure, the first high refractive index compound and the second high refractive index compound may be identical or different. In the present disclosure, the thickness of the second high refractive index compound film is consistent with that of the second high refractive index compound film in the above technical solution, which will not be elaborated herein. A method for magnetron-sputtering the second high refractive index compound onto the surface of the second metal target material film is not specially restricted in the present disclosure, and a magnetron-sputtering technical solution familiar to those skilled in the art is adopted. In an embodiment of the present disclosure, sputtering gas for magnetron-sputtering the second high refractive index compound onto the surface of the second metal target material film may be Ar gas. In an embodiment of the present disclosure, sputtering gas and reactive gas for magnetron-sputtering the second high refractive index compound onto the surface of the second metal target material film may respectively be Ar gas and oxygen. In an embodiment of the present disclosure, the thickness of the second high refractive index compound film may be adjusted by controlling magnetron-sputtering power.

In a preferred embodiment of the present disclosure, after the second high refractive index compound film is obtained, the second metal oxide is magnetron-sputtered onto the surface of the second high refractive index compound film in the present disclosure, so as to obtain the second metal oxide film disposed on the surface of the second high refractive index compound film. In the present disclosure, the type and source of the second metal oxide are consistent with the type and source of the metal oxide in the above technical solution, which will not be elaborated herein. In the present disclosure, the first metal oxide and the second metal oxide may be identical or different. In the present disclosure, the thickness of the second metal oxide film is consistent with that of the second metal oxide film in the above technical solution, which will not be elaborated herein. A method for magnetron-sputtering the second metal oxide onto the surface of the second high refractive index compound film is not specially restricted in the present disclosure, and a magnetron-sputtering technical solution familiar to those skilled in the art is adopted. In an embodiment of the present disclosure, sputtering gas for magnetron-sputtering the second metal oxide onto the surface of the second high refractive index compound film may be Ar gas. In an embodiment of the present disclosure, sputtering gas and reactive gas for magnetron-sputtering the second metal oxide onto the surface of the second high refractive index compound film may respectively be Ar gas and oxygen. In an embodiment of the present disclosure, the thickness of the second metal oxide film may be adjusted by controlling magnetron-sputtering power.

In a preferred embodiment of the present disclosure, after the second metal oxide film is obtained, the second silver-containing metal is magnetron-sputtered onto the surface of the second metal oxide film in the present disclosure, so as to obtain the second silver-containing metal film disposed on the surface of the second metal oxide film. In the present disclosure, the type and source of the second silver-containing metal are consistent with the type and source of the silver-containing metal in the above technical solution, which will not be elaborated herein. In the present disclosure, the first silver-containing metal and the second silver-containing metal may be identical or different. In the present disclosure, the thickness of the second silver-containing metal film is consistent with that of the second silver-containing metal film in the above technical solution, which will not be elaborated herein. A method for magnetron-sputtering the second silver-containing metal onto the surface of the second metal oxide film is not specially restricted in the present disclosure, and a magnetron-sputtering technical solution familiar to those skilled in the art is adopted. In an embodiment of the present disclosure, sputtering gas for magnetron-sputtering the second silver-containing metal onto the surface of the second metal oxide film may be Ar gas. In an embodiment of the present disclosure, the thickness of the second silver-containing metal film may be adjusted by controlling magnetron-sputtering power.

In a preferred embodiment of the present disclosure, after the second silver-containing metal film is obtained, the third metal target material is magnetron-sputtered onto the surface of the second silver-containing metal film in the present disclosure, so as to obtain the third metal target material film disposed on the surface of the second silver-containing metal film. In the present disclosure, the type and source of the third metal target material are consistent with the type and source of the metal target material in the above technical solution, which will not be elaborated herein. In the present disclosure, the first metal target material, the second metal target material and the third metal target material may be identical or different. In the present disclosure, the thickness of the third metal target material film is consistent with that of the third metal target material film in the above technical solution, which will not be elaborated herein. A method for magnetron-sputtering the third metal target material onto the surface of the second silver-containing metal film is not specially restricted in the present disclosure, and a magnetron-sputtering technical solution familiar to those skilled in the art is adopted. In an embodiment of the present disclosure, sputtering gas for magnetron-sputtering the third metal target material onto the surface of the second silver-containing metal film may be Ar gas. In an embodiment of the present disclosure, the thickness of the third metal target material film may be adjusted by controlling magnetron-sputtering power.

In a preferred embodiment of the present disclosure, after the third metal target material film is obtained, the third high refractive index compound is magnetron-sputtered onto the surface of the third metal target material film, so as to obtain a window film, the refractive index of the third high refractive index compound ranging from 2.0 to 2.5. In the present disclosure, the type and source of the third high refractive index compound are consistent with the type and source of the high refractive index compound in the above technical solution, which will not be elaborated herein. In the present disclosure, the first high refractive index compound, the second high refractive index compound and the third high refractive index compound may be identical or different. In the present disclosure, the thickness of the third high refractive index compound film is consistent with that of the third high refractive index compound film in the above technical solution, which will not be elaborated herein. A method for magnetron-sputtering the third high refractive index compound onto the surface of the third metal target material film is not specially restricted in the present disclosure, and a magnetron-sputtering technical solution familiar to those skilled in the art is adopted. In an embodiment of the present disclosure, sputtering gas for magnetron-sputtering the third high refractive index compound onto the surface of the third metal target material film may be Ar gas. In an embodiment of the present disclosure, sputtering gas and reactive gas for magnetron-sputtering the third high refractive index compound onto the surface of the third metal target material film may respectively be Ar gas and oxygen. In an embodiment of the present disclosure, the thickness of the third high refractive index compound film may be adjusted by controlling magnetron-sputtering power.

The window film prepared using the method provided by the present disclosure has better adherence, can be better adhered to a flexible transparent base material, and is less likely to peel off. In addition, the window film prepared using the method provided by the present disclosure also has better oxidation resistance, optical effect and heat insulation effect. Furthermore, the preparation method for the window film provided by the present disclosure is simple in process, and simple and convenient to operate, and facilitates implementation of quantitative production.

In accordance with a standard of ASTM D1003 Transparent Plastic Light Transmittance and Haze Test Method, the VLT of the window film provided by the present disclosure within a range of 380 nm to 780 nm is tested using a spectrophotometer, and a test result shows that the VLT of the window film provided by the present disclosure is greater than or equal to 70%. The Visible Light Reflectivity (VLR) of the window film provided by the present disclosure within the range of 380 nm to 780 nm is tested using the spectrophotometer, and a test result shows that the VLR of the window film provided by the present disclosure is less than or equal to 9.5%. The Infrared light transmittance (IRT) of the window film provided by the present disclosure within a range of 780 nm to 2,500 nm is tested using the spectrophotometer, and a test result shows that the IRT of the window film provided by the present disclosure is less than or equal to 8%. The Total Solar Energy Rejection (TSER) of the window film provided by the present disclosure is tested using the spectrophotometer, the TSER is a ratio of rejected solar energy (mainly referring to visible light, infrared rays and ultraviolet rays) to solar energy emitted to the surface of an object, and a test result shows that the TSER of the window film provided by the present disclosure is greater than 50%. The window film provided by the present disclosure has a better optical effect.

In accordance with ASTM D3359 Detection Standard for Measuring Adhesive Force Using Adhesive Tape, the adherence of the window film provided by the present disclosure is tested. A test result shows that the window film provided by the present disclosure does not peel off absolutely. The window film provided by the present disclosure has better adherence.

The window film provided by the present disclosure is adhered to the surface of a vehicle front windshield using install glue. The front windshield to which the window film is adhered is placed in an aging tester (QUV), and the optical performance thereof is tested every five days until the optical performance is tested for 2,000 hours. A color difference value ($\Delta E$) is calculated in accordance with the following formula:

$$\Delta E = \sqrt{\Delta L^2 + \Delta a^2 + \Delta b^2},$$

where $\Delta L$ is a luminance difference;
$\Delta a$ is a transverse color difference;
$\Delta b$ is a longitudinal color difference.

A test result shows that after the window film provided by the present disclosure is aged in the QUV for 2,000 hours, $\Delta E<1$. The window film provided by the present disclosure has better oxidation resistance.

A specific method for testing the heat insulation effect of the window film provided by the present disclosure includes the steps as follows: A window film provided by the present disclosure is adhered to the surface of a vehicle front windshield using an install glue, and a temperature sensor is installed on the surface of the front windshield, the temperature sensor being connected to a temperature measuring device. A solar infrared lamp is installed at a position, 25 cm away from the outer side of the vehicle front windshield, and continuously irradiates the vehicle front windshield, the power of the solar infrared lamp being 250 W, and the voltage being 230V. A temperature transmitted by the temperature measuring device is recorded. A test result shows that after the window film provided by the present disclosure is irradiated with the infrared lamp for 1,500 s, the temperature rises for 2 to 3 DEG C. A better heat insulation effect is provided.

Raw materials used in the following embodiments of the present disclosure are all commercially available goods.

Embodiment 1

A window film is prepared by a magnetron-sputtering device.

A coiled PET material having the thickness of 23 microns was placed in an uncoiling chamber and served as a substrate to begin preparation;

Ti was magnetron-sputtered onto the surface of the substrate, sputtering gas was Ar gas, and a first layer of Ti film having the thickness of 0.5 nm was obtained by controlling discharge power;

$Nb_2O_5$ was magnetron-sputtered onto the surface of the first layer of Ti film, sputtering gas was Ar gas, and a first layer of $Nb_2O_5$ film having the thickness of 25 nm was obtained by controlling discharge power;

AZO was magnetron-sputtered onto the surface of the first layer of $Nb_2O_5$ film, sputtering gas was Ar gas, reactive gas was $O_2$, and a first layer of AZO film having the thickness of 3 nm was obtained by controlling discharge power;

An Ag alloy was magnetron-sputtered onto the surface of the first layer of AZO film, sputtering gas was Ar gas, and a first layer of Ag alloy film having the thickness of 8 nm was obtained by controlling discharge power, the Ag alloy including 98.5% of Ag and the balance of Zn.

Ti was magnetron-sputtered onto the surface of the first layer of Ag alloy film, sputtering gas was Ar gas, and a second layer of Ti film having the thickness of 0.5 nm was obtained by controlling discharge power.

$Nb_2O_5$ was magnetron-sputtered onto the surface of the second layer of Ti film, sputtering gas was Ar gas, reactive gas was $O_2$, and a second layer of $Nb_2O_5$ film having the thickness of 50 nm was obtained by controlling discharge power.

AZO was magnetron-sputtered onto the surface of the second layer of $Nb_2O_5$ film, sputtering gas was Ar gas, reactive gas was $O_2$, and a second layer of AZO film having the thickness of 3 nm was obtained by controlling discharge power.

An Ag alloy was magnetron-sputtered onto the surface of the second layer of AZO film, sputtering gas was Ar gas, and a second layer of Ag alloy film having the thickness of 12 nm was obtained by controlling discharge power, the Ag alloy including 98.5% of Ag and the balance of Zn.

Ti was magnetron-sputtered onto the surface of the second layer of Ag alloy film, sputtering gas was Ar gas, and a third layer of Ti film having the thickness of 0.5 nm was obtained by controlling discharge power.

$Nb_2O_5$ was magnetron-sputtered onto the surface of the third layer of Ti film, sputtering gas was Ar gas, reactive gas was $O_2$, and a third layer of $Nb_2O_5$ film having the thickness of 26 nm was obtained by controlling discharge power.

A window film was prepared.

The window film prepared in the embodiment 1 of the present disclosure includes: PET, having the thickness of 23 microns; a first layer of Ti film, disposed on the surface of the PET and having the thickness of 0.5 nm; a first layer of $Nb_2O_5$ film, disposed on the surface of the first layer of Ti film and having the thickness of 25 nm; a first layer of AZO film, disposed on the surface of the first layer of $Nb_2O_5$ film and having the thickness of 3 nm; a first layer of Ag alloy film, disposed on the surface of the first layer of AZO film and having the thickness of 8 nm; a second layer of Ti film, disposed on the surface of the first layer of Ag alloy film and having the thickness of 0.5 nm; a second layer of $Nb_2O_5$ film, disposed on the surface of the second layer of Ti film and having the thickness of 50 nm; a second layer of AZO film, disposed on the surface of the second layer of $Nb_2O_5$ film and having the thickness of 3 nm; a second layer of Ag alloy film, disposed on the surface of the second layer of AZO film and having the thickness of 12 nm; a third layer of Ti film, disposed on the surface of the second layer of Ag alloy film and having the thickness of 0.5 nm; and a third layer of $Nb_2O_5$ film, disposed on the surface of the third layer of Ti film and having the thickness of 26 nm.

Figure 2:
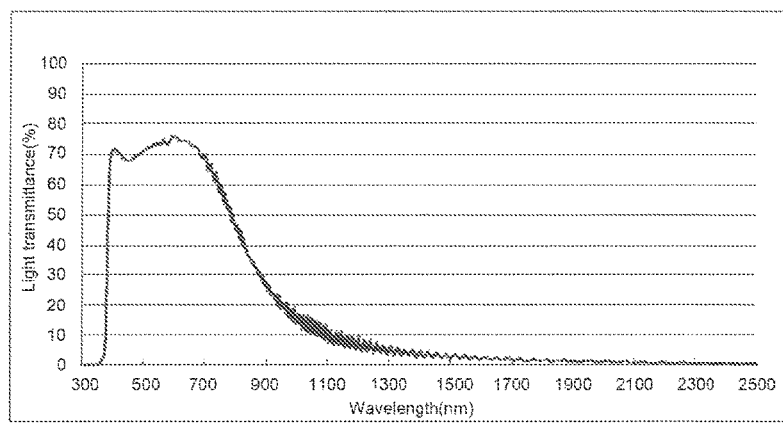
FIG. 2 is a diagram of light transmittance of a window film provided in an embodiment 1 of the present disclosure.

In accordance with the method in the above technical solution, the Visible Light Transmittance (VLT) of the window film prepared in the embodiment 1 of the present disclosure within a range of 380 nm to 780 nm is tested, a test result is shown in FIG. 2, FIG. 2 is a diagram of light transmittance of a window film provided in an embodiment 1 of the present disclosure, and from FIG. 2, it can be obtained that the VLT is 73%. In accordance with the method in the above technical solution, the Visible Light Reflectivity (VLR) of the window film prepared in the embodiment 1 of the present disclosure within the range of 380 nm to 780 nm is tested, and a test result shows that the VLR is 9.5%. In accordance with the method in the above technical solution, the Infrared light transmittance (IRT) of the window film prepared in the embodiment 1 of the present disclosure within a range of 780 nm to 2,500 nm is tested, and a test result shows that the IRT is 7%. In accordance with the method in the above technical solution, the Total Solar Energy Rejection (TSER) of the window film prepared in the embodiment 1 of the present disclosure is tested, and a test result shows that the TSER is greater than 50%. The test results show that the window film prepared in the embodiment 1 of the present disclosure has a better optical effect.

In accordance with the method in the above technical solution, the adherence of the window film prepared in the embodiment 1 of the present disclosure is tested. A test result shows that the window film prepared in the embodiment 1 of the present disclosure does not peel off absolutely, and has better adherence.

In accordance with the method in the above technical solution, the oxidation resistance of the window film prepared in the embodiment 1 of the present disclosure is tested. A test result shows that the window film prepared in the embodiment 1 of the present disclosure is tested in a QUV for 2,000 hours, $\Delta E<1$, and the oxidation resistance is better.

Figure 5:
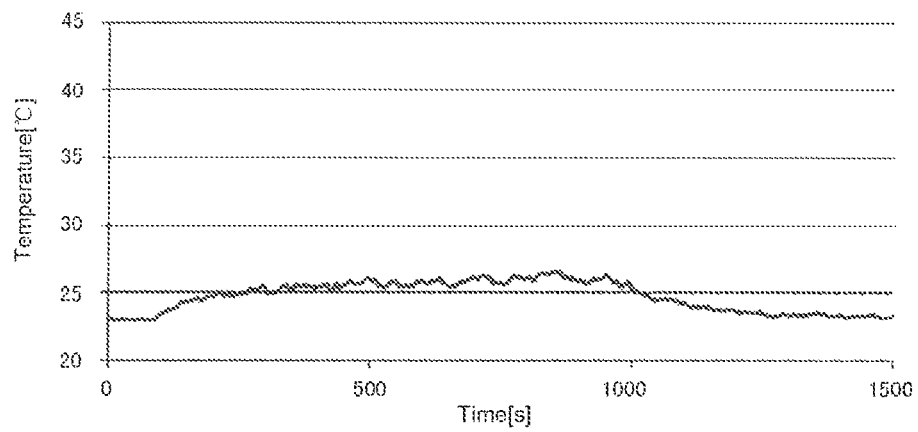
FIG. 5 is a diagram of a heat insulation effect testing result of a window film provided in an embodiment 1 of the present disclosure.

In accordance with the method in the above technical solution, the heat insulation effect of the window film prepared in the embodiment 1 of the present disclosure is tested. A test result is shown in FIG. 5. FIG. 5 is a diagram of a heat insulation effect testing result of a window film provided in an embodiment 1 of the present disclosure. From FIG. 5, it can be obtained that the window film prepared in the embodiment 1 of the present disclosure is irradiated with an infrared lamp for 1,500 s, and the temperature rises for 2 to 3 DEG C., then the heat insulation effect is better.

Embodiment 2

A window film was prepared in accordance with the method in the embodiment 1. The window film prepared in the embodiment 2 of the present disclosure includes: PET, having the thickness of 23 microns; a NiCr film, disposed on the surface of the PET and having the thickness of 0.2 nm; a first layer of $Nb_2O_5$ film, disposed on the surface of the NiCr film and having the thickness of 22 nm; a first layer of $SnO_2$ film, disposed on the surface of the first layer of $Nb_2O_5$ film and having the thickness of 1 nm; a first layer of Ag alloy film, disposed on the surface of the first layer of $SnO_2$ film and having the thickness of 6 nm, the said Ag alloy including 98% of Ag and the balance of Zn and Cu; a first layer of Ti film, disposed on the surface of the first layer of Ag alloy film and having the thickness of 0.3 nm; a second layer of $Nb_2O_5$ film, disposed on the surface of the first layer of Ti film and having the thickness of 53 nm; a second layer of $SnO_2$ film, disposed on the surface of the second layer of $Nb_2O_5$ film and having the thickness of 2 nm; a second layer of Ag alloy film, disposed on the surface of the second layer of $SnO_2$ film and having the thickness of 10 nm, the said Ag alloy including 98% of Ag and the balance of Zn and Cu; a second layer of Ti film, disposed on the surface of the second layer of Ag alloy film and having the thickness of 0.5 nm; and an ITO film, disposed on the surface of the second layer of Ti film and having the thickness of 29 nm.

Figure 3:
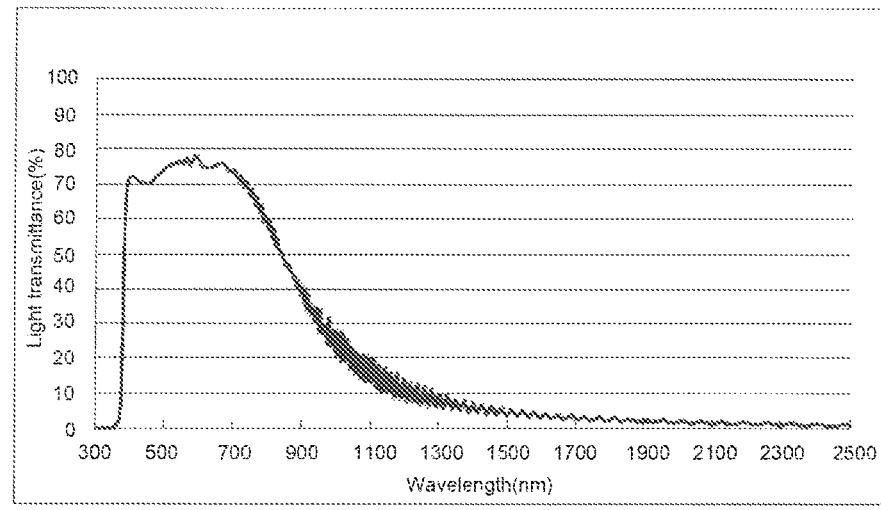
FIG. 3 is a diagram of light transmittance of a window film provided in an embodiment 2 of the present disclosure.

In accordance with the method in the embodiment 1, the VLT of the window film provided in the embodiment 2 of the present disclosure is tested, a test result is shown in FIG. 3, FIG. 3 is a diagram of light transmittance of a window film provided in an embodiment 2 of the present disclosure, and from FIG. 3, it can be obtained that the VLT is 76%. In accordance with the method in the embodiment 1, the VLR of the window film provided in the embodiment 2 of the present disclosure is tested, and a test result shows that the VLR is 8.5%. In accordance with the method in the embodiment 1, the IRT of the window film provided in the embodiment 2 of the present disclosure is tested, and a test result shows that the IRT is 8%. In accordance with the method in the embodiment 1, the TSER of the window film provided in the embodiment 2 of the present disclosure is tested, and a test result shows that the TSER is greater than 50%. The test results show that the window film provided in the embodiment 2 of the present disclosure has a better optical effect.

In accordance with the method in the embodiment 1, the adherence of the window film provided in the embodiment 2 of the present disclosure is tested. A test result shows that the window film provided in the embodiment 2 of the present disclosure does not peel off absolutely, and has better adherence.

In accordance with the method in the embodiment 1, the oxidation resistance of the window film provided in the embodiment 2 of the present disclosure is tested. A test result shows that the window film provided in the embodiment 2 of the present disclosure is tested in a QUV for 2,000 hours, $\Delta E<1\%$, and the oxidation resistance is better.

In accordance with the method in the embodiment 1, the heat insulation effect of the window film provided in the embodiment 2 of the present disclosure is tested. A test result shows that the window film provided in the embodiment 2 of the present disclosure is irradiated with an infrared lamp for 1,500 s, and the temperature rises for 2 to 3 DEG C., then the heat insulation effect is better.

Embodiment 3

A window film was prepared in accordance with the method in the embodiment 1. The window film prepared in the embodiment 3 of the present disclosure includes: PET, having the thickness of 23 microns; a Ti film, disposed on the surface of the PET and having the thickness of 0.4 nm; a $Si_3N_4$ film, disposed on the surface of the Ti film and having the thickness of 27 nm; a $SnO_2$ film, disposed on the surface of the $Si_3N_4$ film and having the thickness of 2 nm; a first layer of Ag alloy film, disposed on the surface of the $SnO_2$ film and having the thickness of 7 nm, the said Ag alloy including 99% of Ag and the balance of In; a first layer of NiCr film, disposed on the surface of the first layer of Ag alloy film and having the thickness of 0.3 nm; a $Nb_2O_5$ film, disposed on the surface of the first layer of NiCr film and having the thickness of 47 nm; an AZO film, disposed on the surface of the $Nb_2O_5$ film and having the thickness of 2 nm; a second layer of Ag alloy film, disposed on the surface of the AZO film and having the thickness of 11 nm, the said Ag alloy including 98% of Ag and the balance of In; a second layer of NiCr film, disposed on the surface of the second layer of Ag alloy film and having the thickness of 0.4 nm; and a $TiO_2$ film, disposed on the surface of the second layer of NiCr film and having the thickness of 23 nm.

Figure 4:
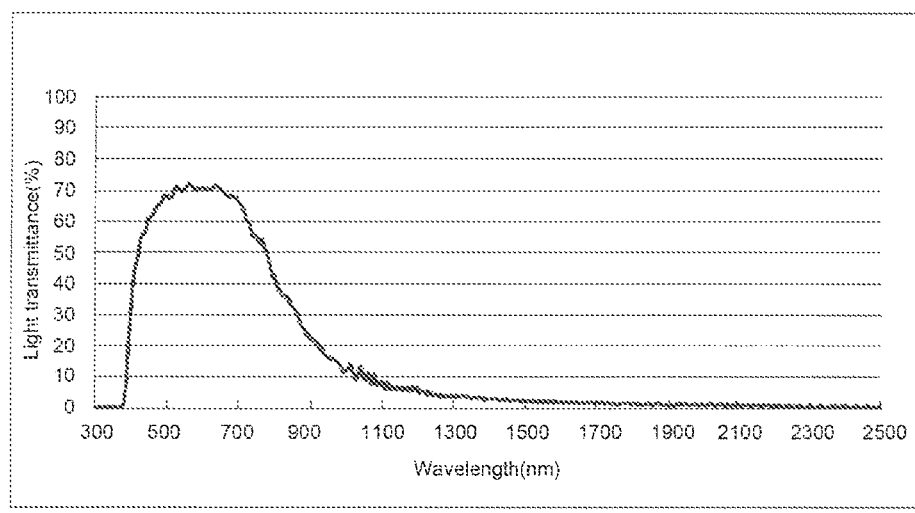
FIG. 4 is a diagram of light transmittance of a window film provided in an embodiment 3 of the present disclosure.

In accordance with the method in the embodiment 1, the VLT of the window film provided in the embodiment 3 of the present disclosure is tested, a test result is shown in FIG. 4, FIG. 4 is a diagram of light transmittance of a window film provided in an embodiment 3 of the present disclosure, and from FIG. 4, it can be obtained that the VLT is 70%. In accordance with the method in the embodiment 1, the VLR of the window film provided in the embodiment 3 of the present disclosure is tested, and a test result shows that the VLR is 9.2%. In accordance with the method in the embodiment 1, the IRT of the window film provided in the embodiment 3 of the present disclosure is tested, and a test result shows that the IRT is 5%. In accordance with the method in the embodiment 1, the TSER of the window film provided in the embodiment 3 of the present disclosure is tested, and a test result shows that the TSER is greater than 50%. The test results show that the window film provided in the embodiment 3 of the present disclosure has a better optical effect.

In accordance with the method in the embodiment 1, the adherence of the window film provided in the embodiment 3 of the present disclosure is tested. A test result shows that the window film provided in the embodiment 3 of the present disclosure does not peel off absolutely, and has better adherence.

In accordance with the method in the embodiment 1, the oxidation resistance of the window film provided in the embodiment 3 of the present disclosure is tested. A test result shows that the window film provided in the embodiment 3 of the present disclosure is tested in a QUV for 2,000 hours, $\Delta E<1$, and the oxidation resistance is better.

In accordance with the method in the embodiment 1, the heat insulation effect of the window film provided in the embodiment 3 of the present disclosure is tested. A test result shows that the window film provided in the embodiment 3 of the present disclosure is irradiated with an infrared lamp for 1,500 s, and the temperature rises for 2 to 3 DEG C., then the heat insulation effect is better.

Embodiment 4

A window film was prepared in accordance with the method in the embodiment 1. The window film prepared in the embodiment 4 of the present disclosure includes: PET, having the thickness of 23 microns; a NiCr film, disposed on the surface of the PET and having the thickness of 0.2 nm; a $Nb_2O_5$ film, disposed on the surface of the NiCr film and having the thickness of 24 nm; a $SnO_2$ film, disposed on the surface of the $Nb_2O_5$ film and having the thickness of 2 nm; the said Ag alloy film, disposed on the surface of the $SnO_2$ film and having the thickness of 10 nm, the said Ag alloy including 99% of Ag and the balance of In; a Ti film, disposed on the surface of the Ag alloy film and having the thickness of 0.3 nm; and an ITO film, disposed on the surface of the Ti film and having the thickness of 27 nm.

Figure 6:
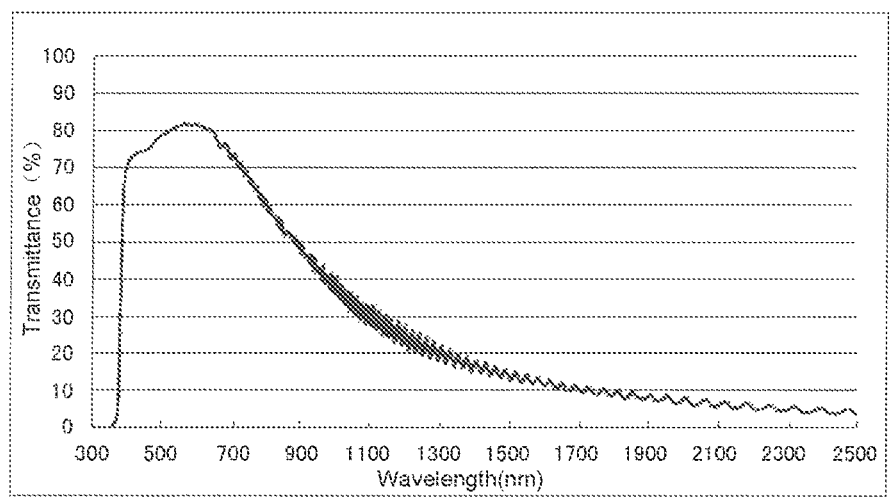
FIG. 6 is a diagram of light transmittance of a window film provided in an embodiment 4 of the present disclosure.

In accordance with the method in the embodiment 1, the VLT of the window film provided in the embodiment 4 of the present disclosure is tested, a test result is shown in FIG. 6, FIG. 6 is a diagram of light transmittance of a window film provided in an embodiment 4 of the present disclosure, and from FIG. 6, it can be obtained that the VLT is 81%. In accordance with the method in the embodiment 1, the VLR of the window film provided in the embodiment 4 of the present disclosure is tested, and a test result shows that the VLR is 11.5%. In accordance with the method in the embodiment 1, the IRT of the window film provided in the embodiment 4 of the present disclosure is tested, and a test result shows that the IRT is 18%. In accordance with the method in the embodiment 1, the TSER of the window film provided in the embodiment 4 of the present disclosure is tested, and a test result shows that the TSER is greater than 40%. The test results show that the window film provided in the embodiment 4 of the present disclosure has a better optical effect.

In accordance with the method in the embodiment 1, the adherence of the window film provided in the embodiment 4 of the present disclosure is tested. A test result shows that the window film provided in the embodiment 4 of the present disclosure does not peel off absolutely, and has better adherence.

In accordance with the method in the embodiment 1, the oxidation resistance of the window film provided in the embodiment 4 of the present disclosure is tested. A test result shows that the window film provided in the embodiment 4 of the present disclosure is tested in a QUV for 2,000 hours, $\Delta E<1$, and the oxidation resistance is better.

In accordance with the method in the embodiment 1, the heat insulation effect of the window film provided in the embodiment 4 of the present disclosure is tested. A test result shows that the window film provided in the embodiment 4 of the present disclosure is irradiated with an infrared lamp for 1,500 s, and the temperature rises for 2 to 3 DEG C., then the heat insulation effect is better.

What is claimed is:
1. A window film comprising:
 a flexible transparent base material, the flexible transparent base material serving as a substrate;
 a first metal target material film, disposed on a surface of the flexible transparent base material;
 a first high refractive index compound film, disposed on a surface of the first metal target material film, a refractive index of the first high refractive index compound film ranging from 2.0 to 2.5;
 a first metal oxide film, disposed on a surface of the first high refractive index compound film, a material of the first metal oxide film being selected from a transition metal oxide or a tin oxide;
 a first silver-containing metal film, disposed on a surface of the first metal oxide film;
 a second metal target material film, disposed on a surface of the first silver-containing metal film; and
 a second high refractive index compound film, disposed on a surface of the second metal target material film, a refractive index of the second high refractive index compound film ranging from 2.0 to 2.5.

2. The window film of claim 1, further comprising:
 a second metal oxide film, disposed on a surface of the second high refractive index compound film, the second metal oxide film being made from a transition metal oxide or a tin oxide;
 a second silver-containing metal film, disposed on a surface of the second metal oxide film;
 a third metal target material film, disposed on a surface of the second silver-containing metal film; and
 a third high refractive index compound film, disposed on a surface of the third metal target material film, a refractive index of the third high refractive index compound film ranging from 2.0 to 2.5.

3. The window film of claim 1, wherein a thickness of the flexible transparent base material ranges from 20 microns to 30 microns.

4. The window film of claim 1, wherein a material of the first metal target material film and a material of the second metal target material film are independently selected from Zn, Ti, Cu, Ni, NiCr or Cr.

5. The window film of claim 1, wherein a thickness of the first metal target material film and a thickness of the second metal target material film independently range from 0.2 nm to 0.8 nm.

6. The window film of claim 1, wherein the refractive index of the first high refractive index compound film and the refractive index of the second high refractive index compound film independently range from 2.2 to 2.3.

7. The window film of claim 1, wherein a material of the first high refractive index compound film and a material of the second high refractive index compound film are independently selected from $Nb_2O_5$, ITO, $Si_3N_4$, $SnO_2$, $TiO_2$ or $TaO_2$.

8. The window film of claim 1, wherein a thickness of the first high refractive index compound film ranges from 22 nm to 30 nm.

9. The window film of claim 2, wherein the material of the second metal oxide film and the first metal oxide film are independently selected from zinc oxides, tin oxides or Aluminum-doped Zinc Oxides.

10. The window film of claim 1, wherein a thickness of the second metal oxide film and the first metal oxide film independently range from 1 nm to 5 nm.

11. The window film of claim 1, wherein a material of the first silver-containing metal film is selected from silver or a silver alloy.

12. The window film of claim 1, wherein a thickness of the first silver-containing metal film ranges from 5 nm to 12 nm.

13. The window film of claim 1, wherein a thickness of the second high refractive index compound film ranges from 22 nm to 27 nm.

14. The window film of claim 2, wherein a thickness of the third high refractive index compound film ranges from 20 nm to 30 nm.

15. The window film of claim 1, wherein the Visible Light Transmittance of the window film within a range of 380 nm to 780 nm is greater than 72%, and the Infrared Light Transmittance of the window film within a range of 780 nm to 2,500 nm is less than 10%.

16. A preparation method for a window film, comprising:
1) magnetron-sputtering a first metal target material onto a surface of a flexible transparent base material, and obtaining a first metal target material film disposed on the surface of the flexible transparent base material;
2) magnetron-sputtering a first high refractive index compound onto a surface of the first metal target material film, and obtaining a first high refractive index compound film disposed on the surface of the first metal target material film, a refractive index of the first high refractive index compound ranging from 2.0 to 2.5;
3) magnetron-sputtering a first metal oxide onto a surface of the first high refractive index compound film, and obtaining a first metal oxide film disposed on the surface of the first high refractive index compound film, the first metal oxide being selected from a transition metal oxide or a tin oxide;
4) magnetron-sputtering first silver-containing metal onto a surface of the first metal oxide film, and obtaining a first silver-containing metal film disposed on the surface of the first metal oxide film;
5) magnetron-sputtering a second metal target material onto a surface of the first silver-containing metal film, and obtaining a second metal target material film disposed on the surface of the first silver-containing metal film; and
6) magnetron-sputtering a second high refractive index compound onto a surface of the second metal target material film, and obtaining a window film, a refractive index of the second high refractive index compound ranging from 2.0 to 2.5.

* * * * *